United States Patent
Hayakawa

[11] Patent Number: 6,049,661
[45] Date of Patent: Apr. 11, 2000

[54] METHOD OF SIMULATING SHAPE OF SAMPLE AFTER SURFACE REACTION PROCESSING, APPARATUS AND RECORDING MEDIUM

[75] Inventor: Koichi Hayakawa, Kanagawa, Japan

[73] Assignee: Sony Corporation, Tokyo, Japan

[21] Appl. No.: 09/057,530

[22] Filed: Apr. 9, 1998

[30] Foreign Application Priority Data

Apr. 9, 1997 [JP] Japan ................................... 9-090834

[51] Int. Cl.[7] ................................................. G06F 9/455
[52] U.S. Cl. ................................. 395/500.34; 395/500.41
[58] Field of Search ............................ 427/229, 255.37, 427/561, 597; 395/500.34, 500.27, 500.35, 500.36, 500.23, 500.41

[56] References Cited

U.S. PATENT DOCUMENTS

| | | | |
|---|---|---|---|
| 4,938,996 | 7/1990 | Ziv et al. | 427/597 |
| 5,204,141 | 4/1993 | Roberts et al. | 427/255.37 |
| 5,230,924 | 7/1993 | Li | 427/229 |
| 5,858,476 | 1/1999 | Siess | 427/561 |

OTHER PUBLICATIONS

Harafuji and Misaka, Dry Etching Topography Simulator with a New Surface Reation Model: Modern, Nov. 1995, pp. 1903–1911.

Misaka et al., A Simulation of Micro–Loading Phenomena in Dry–Etching Process using a New Adsorption Model, Jun. 1993, 857–860.

Rey et al., Numerical Simulation of CVD Trench Filling using a Surface Reation Coefficient Model, Jun. 1990, 425–427.

*Primary Examiner*—Kevin J. Teska
*Assistant Examiner*—Dan Fiul
*Attorney, Agent, or Firm*—Hill & Simpson

[57] ABSTRACT

A method of simulating the shape of a sample after a surface reaction processing in a short calculation time, where a partial pressure $P_S$ of the reaction gas used for a surface reaction at the surface of the sample is calculated from an equation $P_S = P_0 - R \times J$ by using the partial pressure $P_0$ of the reaction gas in the gas feed unit used for the surface reaction, a transport resistance $R$ of the reaction gas in a chamber for performing the surface reaction, and a magnitude $J$ of the flow of the reaction gas numerically found at the time of simulation and this $P_S$ is taken into account in the simulation to calculate the shape of the sample after the surface reaction processing.

15 Claims, 6 Drawing Sheets

6,049,661

METHOD OF SIMULATING SHAPE OF SAMPLE AFTER SURFACE REACTION PROCESSING, APPARATUS AND RECORDING MEDIUM

BACKGROUND OF THE INVENTION

1. Field of the Invention

The present invention relates to a method of simulating the shape of a sample after surface reaction processing, more particularly relates to a method of simulating the shape of a sample after chemical vapor deposition (CVD), etching, or other surface reaction processing. Further, the present invention relates to an apparatus for simulation capable of suitably executing this method of simulation and to a recording medium in which a program of the method of simulation is stored.

2. Description of the Related Art

In the steps for manufacture of a semiconductor device, CVD and dry etching are wildly used methods. In recent years, semiconductor devices have been required to exhibit increasingly high performance such as higher speeds, higher degrees of integration, and greater miniaturization. The control of the CVD and other steps has therefore become very important for increasing the reliability of the steps and enhancing the manufacturing yield etc. of the semiconductor devices to be manufactured.

CVD is a method where a silicon wafer or other sample is placed in a reaction chamber, a material gas is introduced, and the temperature is raised so as to initiate a chemical reaction of the material gas and thereby cause a desired thin layer such as a silicon oxide layer or a silicon nitride layer to deposit on the surface of the sample. For example, in order to cause a silicon oxide layer to deposit, a gas containing silane and oxygen etc. is introduced. As the CVD, various methods such as atmospheric pressure CVD, low pressure CVD, and plasma enhanced CVD have been known.

Dry etching is a method where a silicon wafer or other sample is placed in an evacuated reaction chamber, an etching gas is introduced, high frequency power is applied to cause a discharge and generate plasma, and ions and radicals produced in the plasma are made to strike the surface of the sample so as to cause a chemical reaction and etching. For example, the fluorine radicals produced from carbon tetrafluoride are radicals having a very high reactivity and can etch a silicon layer and silicon oxide layer. As the dry etching, a variety of methods such as plasma etching, chemical dry etching, or reactive ion etching have been known.

The partial pressure of the material gas in CVD or the etching gas in the dry etching process (hereinafter these gases will be referred to together as the "reaction gas") at the surface of the sample of the semiconductor wafer or the like (hereinafter simply referred to as the surface of the sample) is frequently lower than the gas pressure in the vicinity of the gas feed port of the chamber.

FIG. 1 shows the flow of the reaction gas in a chamber when processing such as CVD or etching is carried out. The reaction gas fed from a gas feed port 60 is deposited due to the chemical reaction or consumed due to the surface reaction such as etching on the surface of the sample 63, therefore the reaction gas flows in a direction 62 from the chamber to the surface of the sample 63. The unreacted reaction gas and gas generated due to the surface reaction are exhausted to the exhaust port for adjusting the pressure in the chamber, so the gas flows in the direction indicated by an arrow 61 in the entire chamber along with this. Due to the resistance of this flow, the partial pressure of the reaction gas at the surface of the sample is lowered.

FIG. 2 is a graph of the relationship between the partial pressure of the reaction gas and the distance from the surface of the sample. It indicates that the partial pressure of the reaction gas is a pressure $P_0$ in the vicinity of the reaction gas feed port, but becomes gradually lower from the reaction gas feed port nearer to the surface of the sample and becomes the pressure $P_S$ at the surface of the sample.

The amount of reduction of the partial pressure of the reaction gas at the surface of the sample from the partial pressure at the reaction gas feed port depends upon the resistance of the chamber and the magnitude of the flow of the reaction gas. The resistance of the chamber does not change much at all in a process such as the CVD process, but the magnitude of the flow of the reaction gas changes considerably according to the amount of consumption of molecules of reaction gas at the surface of the sample. For this reason, the partial pressure of the reaction gas at the surface of the sample can change during a process such as the CVD process.

The reaction rate at the surface of the sample, that is, the deposition rate in the CVD process or the etching rate in the etching process, depends upon the number of molecules of the reaction gas striking the surface of the sample, that is, the partial pressure of the reaction gas at the surface of the sample. Accordingly, it is very important in a simulation of the shape of the sample after CVD, etching, or other processing to find the partial pressure of the reaction gas at the surface of the sample.

The following methods have been considered to deal with the effect of transport of the reaction gas in the chamber In the simulation of the shape of the sample after CVD, etching, or other processing.

1. Method Not Taking into Account the Effect of the Transport of the Reaction Gas in the Gas Phase The simplest method is the method of ignoring the effect of the transport of the reaction gas in the gas phase. The partial pressure of the reaction gas in the chamber is sufficiently low, so there is no problem where the mean free path of the molecules of the reaction gas is larger than the chamber.

2. Method of Taking Into Account up to the Transport of the Reaction Gas in the Gas Phase The reaction at the surface of the sample and the flow of the reaction gas in the chamber are simultaneously simulated, the partial pressure of the reaction gas at the surface of the sample is found, and the shape of the sample after processing is simulated.

3. Method of Calculating the Reduction of the Partial Pressure from the Flow of the Reaction Gas Assumed in Advance This is a method of finding the partial pressure of the reaction gas at the surface of the sample by using the rate of growth found from experiments on the growth of layer on the surface of a flat sample.

In the three types of methods described above, however, there are the following problems. First, in the method not taking into account the effect of the transport of the reaction gas in the gas phase, when the mean free path of the molecules of the reaction gas is not larger than the chamber, an effect which cannot be ignored appears in the simulation of the shape of the sample after processing and correct simulation becomes difficult.

The method taking into account up to the transport of the reaction gas in the gas phase has the problem that a very long time is taken for the simulation. This is because, contrary to the simulation of the shape of the sample after processing paying attention to the micro region (for example, about a few microns), for the transport of the reaction gas in the gas phase in the chamber, it is necessary to take the macro region into account. For this reason, enormous calculations have to be carried out and there is much waste. For example, taking into account the transport of the reaction gas in the gas phase in a chamber requires solution of a fluid equation (Navier-Stokes' equation) or use of the Monte-Carlo method, but both suffer from the problem of long time calculation.

The method of calculating the reduction of the partial pressure from the flow of the reaction gas assumed in advance has the advantage that the time taken for calculation is not long like the above, but in actual layer forming processing, the layer is formed not on a flat surface, but on an even surface, and, the surface area of the layer-forming surface changes along with the elapse of time. Therefore, the surface area of the flat sample used in the experiment on the partial pressure of the reaction gas found by this method and the actual surface area of the layer-forming surface are different. As a result, there is a problem that the estimate of the partial pressure of the reaction gas at the surface of the sample is not correct.

SUMMARY OF THE INVENTION

An object of the present invention is to provide a method of simulation for calculating the correct partial pressure of reaction gas at the surface of a sample, something which has been difficult to do in simulations due to the necessity of an enormous calculation time, and simulating the shape of the sample after CVD, etching, or other processing.

Another object of the present invention is to provide an apparatus for simulation capable of suitably executing this method of simulation.

A still further object of the present invention is to provide a recording medium in which a program of the method of simulation is stored.

To attain the first object, a method of simulating the shape of a sample after surface reaction processing according to a first aspect of the present invention, is comprising calculating a partial pressure $P_S$ of reaction gas used for the surface reaction at the surface of the sample from an equation $P_S = P_0 - R \times J$ using the partial pressure $P_0$ at a gas feed port of the reaction gas used for the surface reaction, a transport resistance R of the reaction gas in a chamber for performing the surface reaction, and a magnitude J of the flow of the reaction gas numerically found at the time of simulation and taking this $P_S$ into account in the simulation to calculating the shape of the sample after the surface reaction processing.

According to the method of simulating the shape of a sample after surface reaction processing of the present invention, since the magnitude J of the flow of the reaction gas is numerically found and the partial pressure $P_S$ of the reaction gas at the surface of the sample is found by this, the correct partial pressure of the reaction gas at the surface of the sample, which has been difficult to take into account in simulations due to the necessity of an enormous calculation time, is calculated to enable the simulation of the shape of the sample after CVD, etching, or other processing. Here, the transport resistance R of the reaction gas in the chamber can be found from experiments or simulation of the flow of the reaction gas in the chamber.

In the method of simulating the present invention, preferably the magnitude J of the flow of the reaction gas is set to a value obtained by dividing a number C of molecules of the reaction gas reacted at the surface of the sample by a simulation step time $\Delta t$ and a surface area S of a region into which the reaction gas of the calculation region of the shape simulation is passed.

Alternatively, preferably, the magnitude J of the flow of the reaction gas is set to a value obtained by dividing a difference C between the number of molecules of the reaction gas flowing into the calculation region and the number of molecules flowing out from the calculation region at the surface of the sample in a simulation step time $\Delta t$ by the simulation step time $\Delta t$ and the surface area S of the region into which the reaction gas of the calculation region of the shape simulation is passed.

According to the method of simulating the shape of a sample after surface reaction processing of the present invention, since the value obtained by dividing the consumption of the molecules of the reaction gas in the calculation region by the surface area of the sample in contact with the gas phase is used and the partial pressure of the reaction gas is found by using a net magnitude of the flow of the reaction gas, a more correct simulation can be carried out by a simple method.

Further, to attain the second object, an apparatus for simulation of the shape of a sample after surface reaction processing according to a second aspect of the present invention, is comprising a pre-processing means for creating a model of the sample and processing various data; a main simulation unit for performing simulation for calculating the partial pressure $P_S$ of reaction gas used for the surface reaction at the surface of the sample from an equation $P_S = P_0 - R \times J$ using the partial pressure $P_0$ at a gas feed port of the reaction gas used for the surface reaction, a transport resistance R of the reaction gas in a chamber for performing the surface reaction, and a magnitude J of the flow of the reaction gas numerically found at the time of simulation and taking this $P_S$ into account in the simulation to calculate the shape of the sample after the surface reaction processing; and a post-processing means for converting the shape of a sample data output from the main simulation unit to a shape suited to a predetermined output format and outputting the same.

According to the apparatus for simulation of the shape of a sample after surface reaction processing of the present invention, since the magnitude J of the flow of the reaction gas is numerically found and the partial pressure $P_S$ of the reaction gas at the surface of the sample is found by this, the correct partial pressure of the reaction gas at the surface of the sample, which has been difficult to take into account in simulations due to the necessity of an enormous calculation time, is calculated and the simulation of the shape of the sample after CVD, etching, or other processing can be carried out. Here, the transport resistance R of the reaction gas in the chamber can be found from experiments or simulation of the flow of the reaction gas in the chamber.

In the apparatus for simulation of the shape of a sample after surface reaction processing of the present invention, preferably, in the main simulation unit, the simulation is carried out by using the value obtained by dividing the number C of molecules of the reaction gas reacted at the surface of the sample by the simulation step time $\Delta t$ and the surface area S of the region into which the reaction gas of the calculation region of the shape simulation is passed as the magnitude J of the flow of the reaction gas.

Alternatively, preferably, in the main simulation unit, the simulation is carried out by using the value obtained by dividing the difference C between the number of molecules of the reaction gas flowing into the calculation region and the number of molecules flowing out from the calculation region at the surface of the sample in the simulation step time $\Delta t$ by the simulation step time $\Delta t$ and the surface area S of the region into which the reaction gas of the calculation region of the shape simulation is passed as the magnitude J of the flow of the reaction gas.

According to the apparatus for simulation of the shape of a sample after the surface reaction processing of the present invention, since the value obtained by dividing the consumption of the molecules of the reaction gas in the calculation region by the surface area of the sample in contact with the gas phase is used, and the partial pressure of the reaction gas is found using the net magnitude of the flow of the reaction gas, an apparatus for simulation performing more correct simulation by a simple method can be provided.

Further, to attain the third object, a recording medium according to a third aspect of the present invention, stores a simulation program for estimating the shape of a sample after surface reaction processing and comprising calculating a partial pressure $P_S$ of reaction gas used for a surface reaction at the surface of a sample from an equation $P_S=P_0-R\times J$ using the partial pressure $P_0$ at a gas feed port of the reaction gas used for the surface reaction, a transport resistance R of the reaction gas in a chamber for performing the surface reaction, and a magnitude J of the flow of the reaction gas numerically found at the time of simulation and taking this $P_S$ into account in the simulation to calculate the shape of the sample after the surface reaction processing.

Preferably, it stores a simulation program using the value obtained by dividing the number C of molecules of the reaction gas reacted at the surface of the sample by the simulation step time $\Delta t$ and the surface area S of the region into which the reaction gas of the calculation region of the shape simulation is passed as the magnitude J of the flow of the reaction gas or a simulation program using the value found by dividing the difference C between the number of molecules of the reaction gas flowing into the calculation region and the number of molecules flowing out from the calculation region at the surface of the sample in a simulation step time $\Delta t$ by the simulation step time $\Delta t$ and the surface area S of the region into which the reaction gas of the calculation region of the shape simulation is passed as the magnitude J of the flow of the reaction gas.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Below, an apparatus for simulation of the shape of a sample after surface reaction processing according to the present invention and the method of simulation will be explained in detail by referring to the attached drawings. Note, the present invention is not limited to the following embodiments. Note also that an explanation of the recording medium according to the present invention is omitted here since the medium merely records a program showing the procedures of the method of simulating the present invention.

Figure 1:
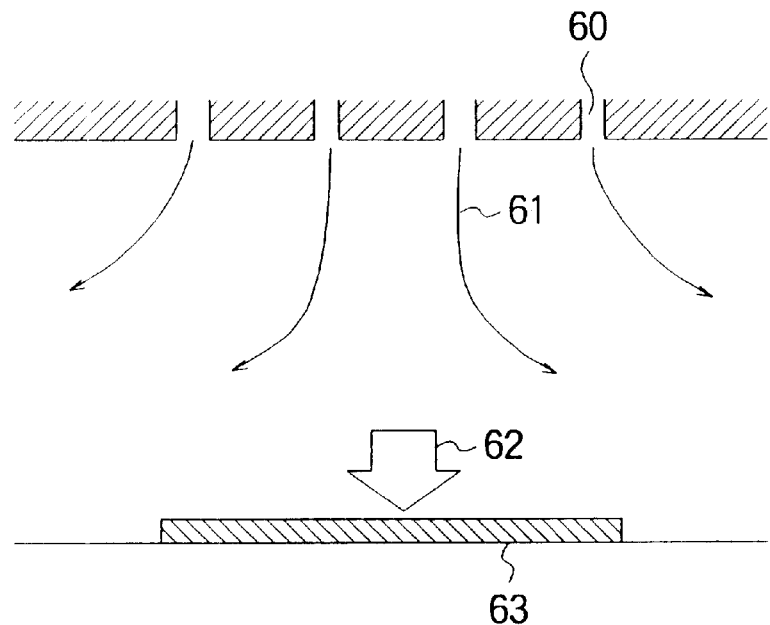
FIG. 1 is a schematic drawing showing the flow of a reaction gas in a chamber.
Figure 2:
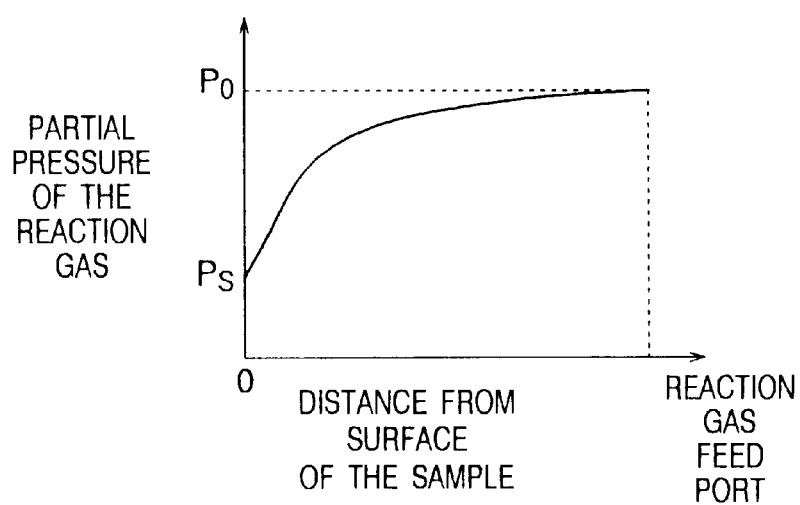
FIG. 2 is a graph of the relationship between a partial pressure of a reaction gas and a distance from the surface of a sample.
Figure 3:
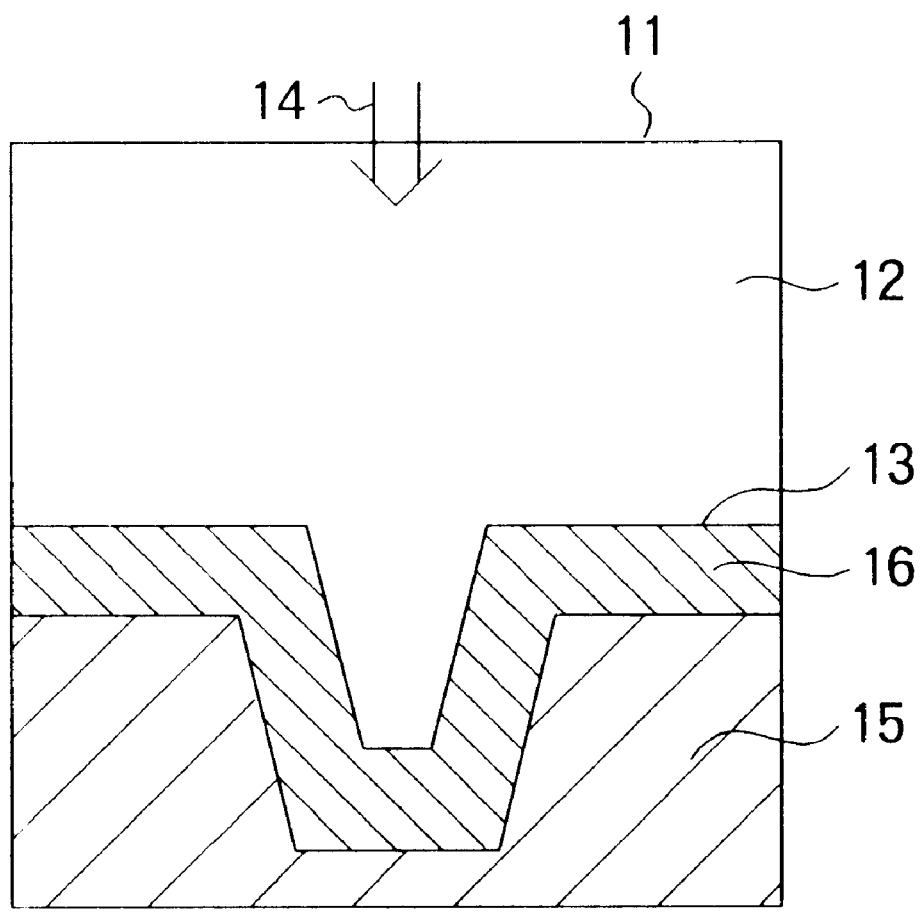
FIG. 3 is a schematic sectional view of a sample for simulation of shape according to the present invention.

FIG. 3 is schematic sectional view of a sample for simulation of shape after CVD, etching, or other processing. Into a calculation region 12 of the shape simulation into which the reaction gas is passed and surrounded by a boundary 11, reaction gas is passed in a direction indicated by an arrow 14. The sample, shown here as having a reaction surface 13 as the boundary of the sample with the reaction gas, is for example comprised of a first layer 15 on upper surface of which is formed a second layer 16. The simulation is carried out for a step of forming a new layer on the upper surface of the second layer 16 or etching the second layer 16.

Figure 4:
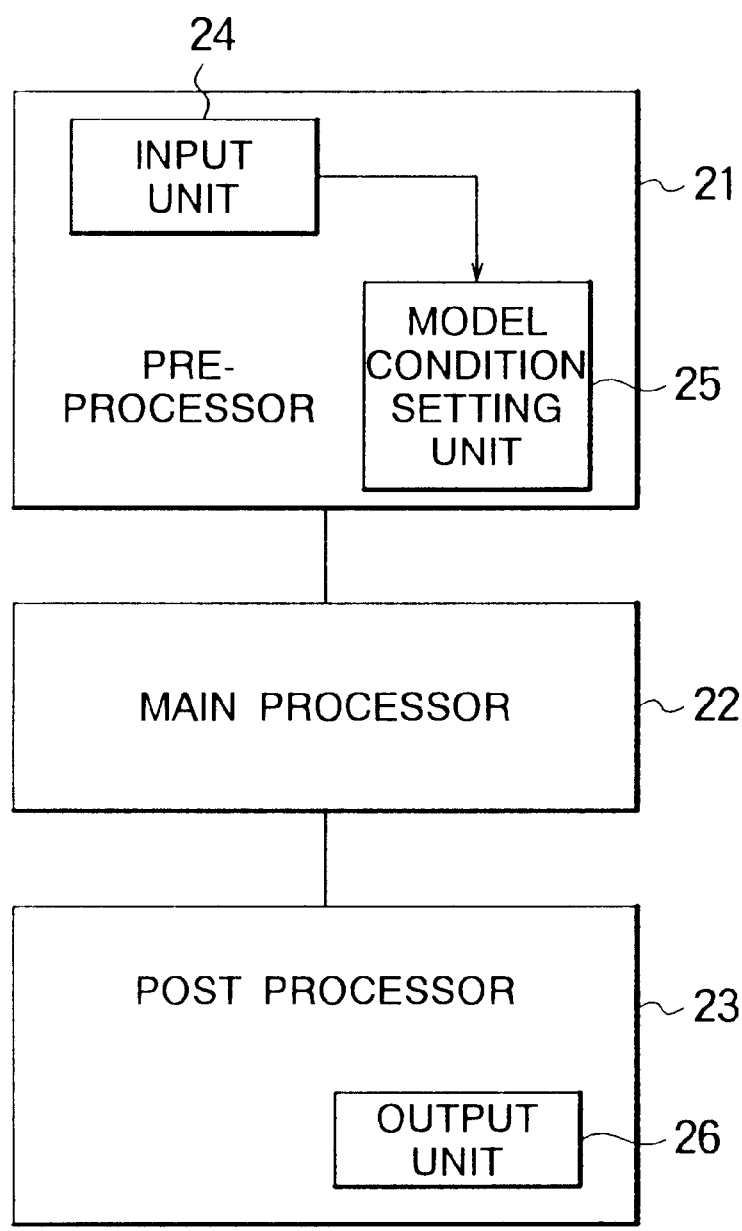
FIG. 4 is a block diagram of a schematic configuration of an apparatus for simulation of the present invention.

FIG. 4 is a block diagram of the schematic configuration of the apparatus for simulation of the present invention. This apparatus for simulation 20 has a pre-processor 21 for creating a rough model of the sample and processing various data, a main processor 22 for calculating the partial pressure of the reaction gas based on the data output from the pre-processor and the shape simulation, a post-processor 23 for converting the result of the main processor 22 to a form adapted to a predetermined output format and outputting the same, and a not illustrated input/output apparatus. Further, a configuration in which a single apparatus has means for performing the function of each of these processors, that is, the pre-processor 21, main processor 22, and post-processor 23, may be adopted too.

The pre-processor 21 has inside it an input unit 24 for receiving as input various data including the gas pressure at the reaction gas feed port or other parameters and a model condition setting unit 25 for creating an analysis model from various data and setting conditions such as the boundary.

The functions and operations of the means will be explained in the following embodiments of the method of simulation.

First Embodiment

Figure 5:
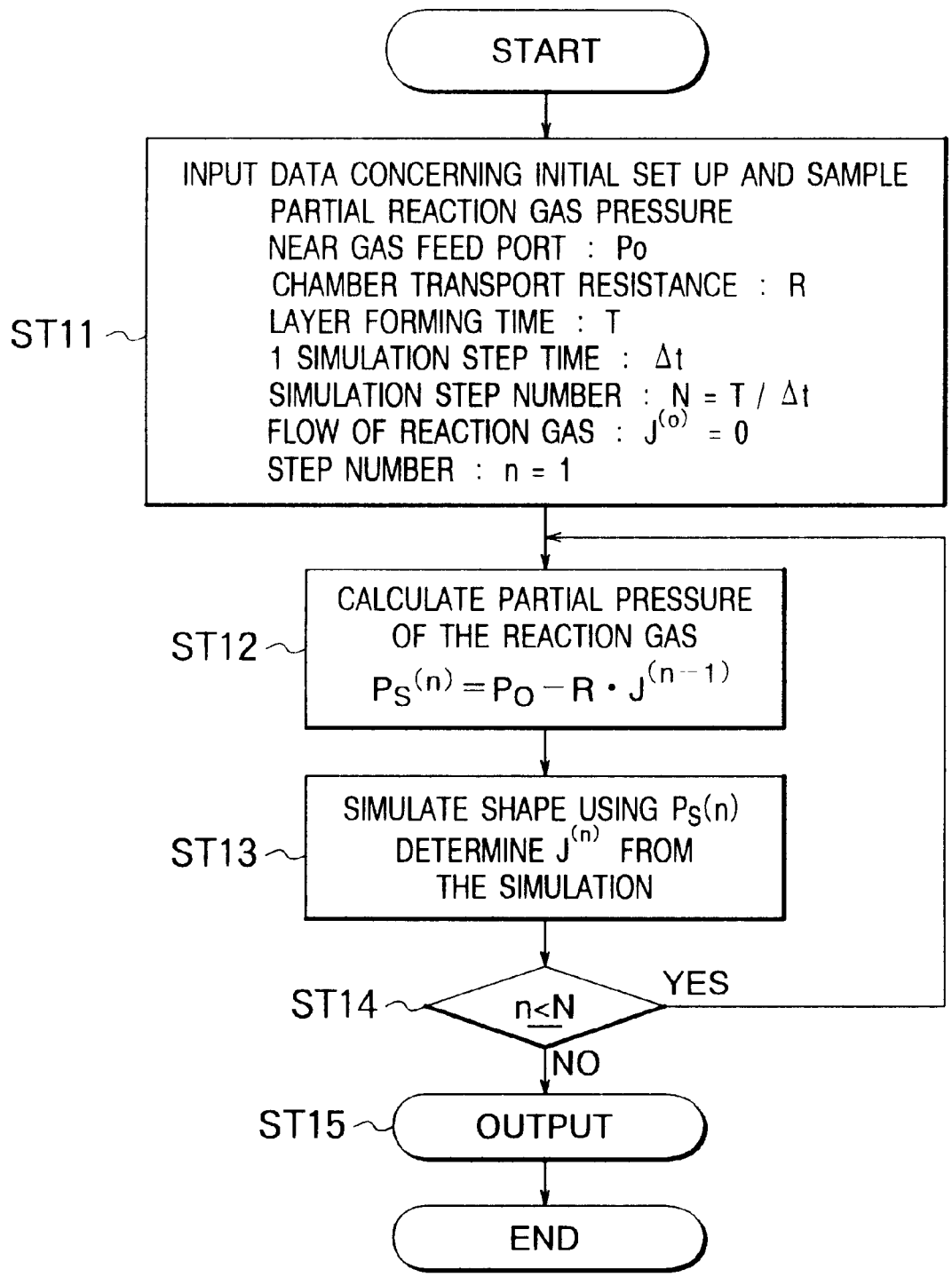
FIG. 5 is a flowchart of a method of simulating a first embodiment.

FIG. 5 is a flowchart of the overall flow of the method of simulating the present embodiment.

At first, the pre-processor receives as input data concerning the sample such as the initial settings and the shape of the sample. The pressure $P_S$ of the reaction gas in the vicinity of the reaction gas feed port, the transport resistance R of the chamber, the reaction time T, and the simulation step time $\Delta t$, which is sufficiently small with respect to the reaction time T, are determined as invariables and are input to the pre-processor together with conditions such as the shape of the sample for simulation. By this, the number of simulation steps $N=T/\Delta t$ is found, and the conditions for calculation in the simulation are actually determined for every simulation. Further, the initial value of the flow of the reaction gas to the surface of the sample is defined as $J^{(0)}=0$, and the value of the variable n indicating the simulation step during processing is defined as $n=1$ (step ST11).

The following steps are then carried out in the main processor. The partial pressure of the reaction gas at the surface of the sample in the n-th simulation step is found from the following equation by using the value $J^{(n-1)}$ of the flow of the reaction gas in the (n−1)th simulation step (step ST12):

$$P_S^{(n)} = P_0 - R \times J^{(n-1)} \quad (1)$$

where, $P_S^{(n)}$ is the partial pressure of the reaction gas at the surface of the sample in the n-th simulation step.

The shape simulation is carried out for exactly the time $\Delta t$ by using the partial pressure of the reaction gas $P_S^{(n)}$ of the n-th simulation step found as described above. The total number $C^{(n)}$ of the molecules of the reaction gas reacted at the surface of the sample during the simulation is counted, and the flow $J^{(n)}$ of the reaction gas in the n-th simulation step is found from the following equation (Step ST13):

$$J^{(n)} = C^{(n)}/(\Delta t \cdot S) \quad (2)$$

where, S is the surface area of the region into which the reaction gas of the shape simulation region is passed. Further, as $C^{(n)}$, it is also possible to use the difference between the number of the molecules of the reaction gas flowing into the calculation region in one simulation step time $\Delta t$ and the number of molecules flowing out.

The number of the simulation steps during processing is increased by one to make n equal to n+1. Where n≦N, the processing routine returns to step ST12, where the simulation is continued. Where n>N, the simulation is ended (step ST14). The result of the obtained simulated shape is output to the post-processor (step ST15).

Second Embodiment

Figure 6:
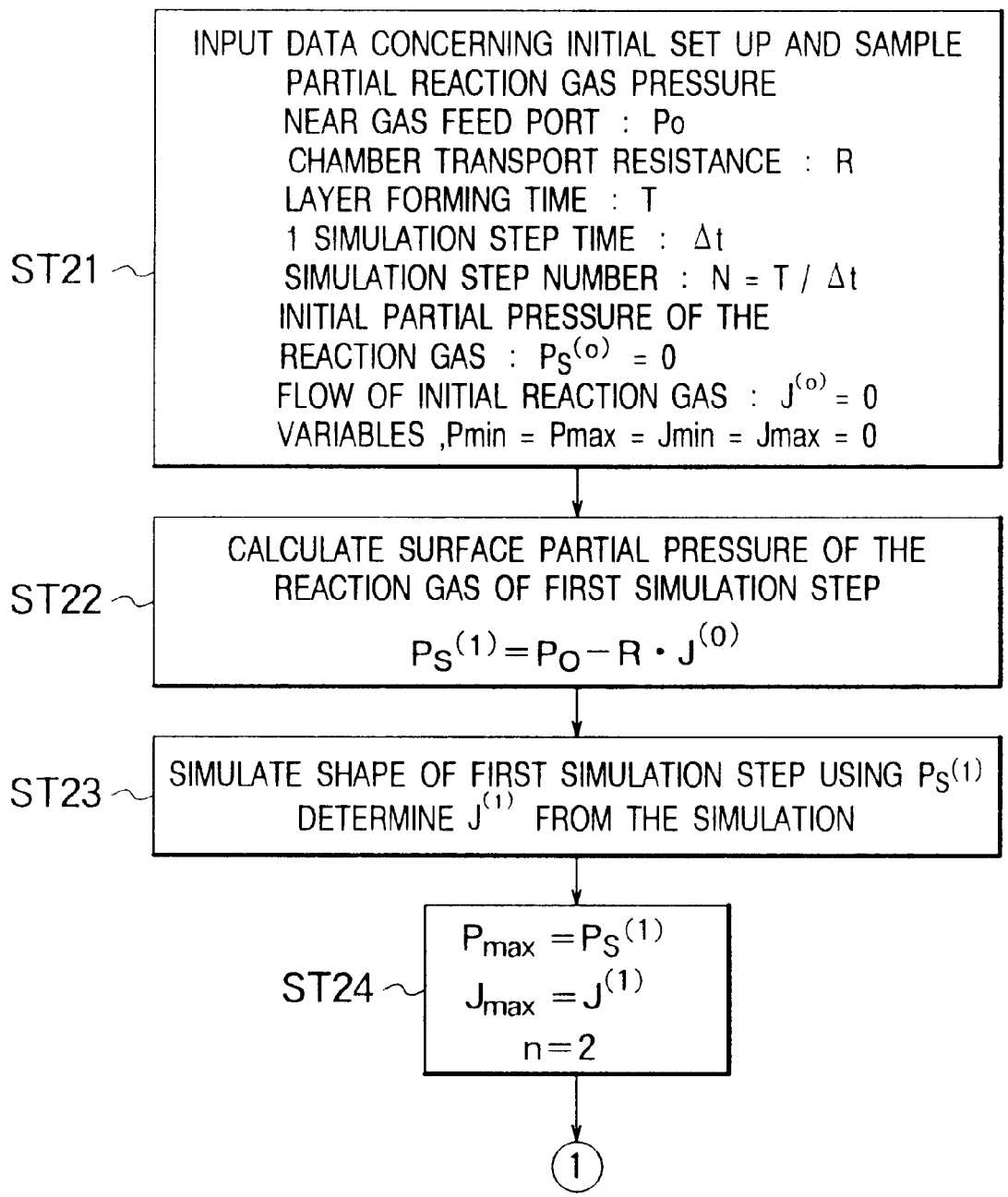
FIG. 6 is a flowchart of a method of simulating a second embodiment.
Figure 7:
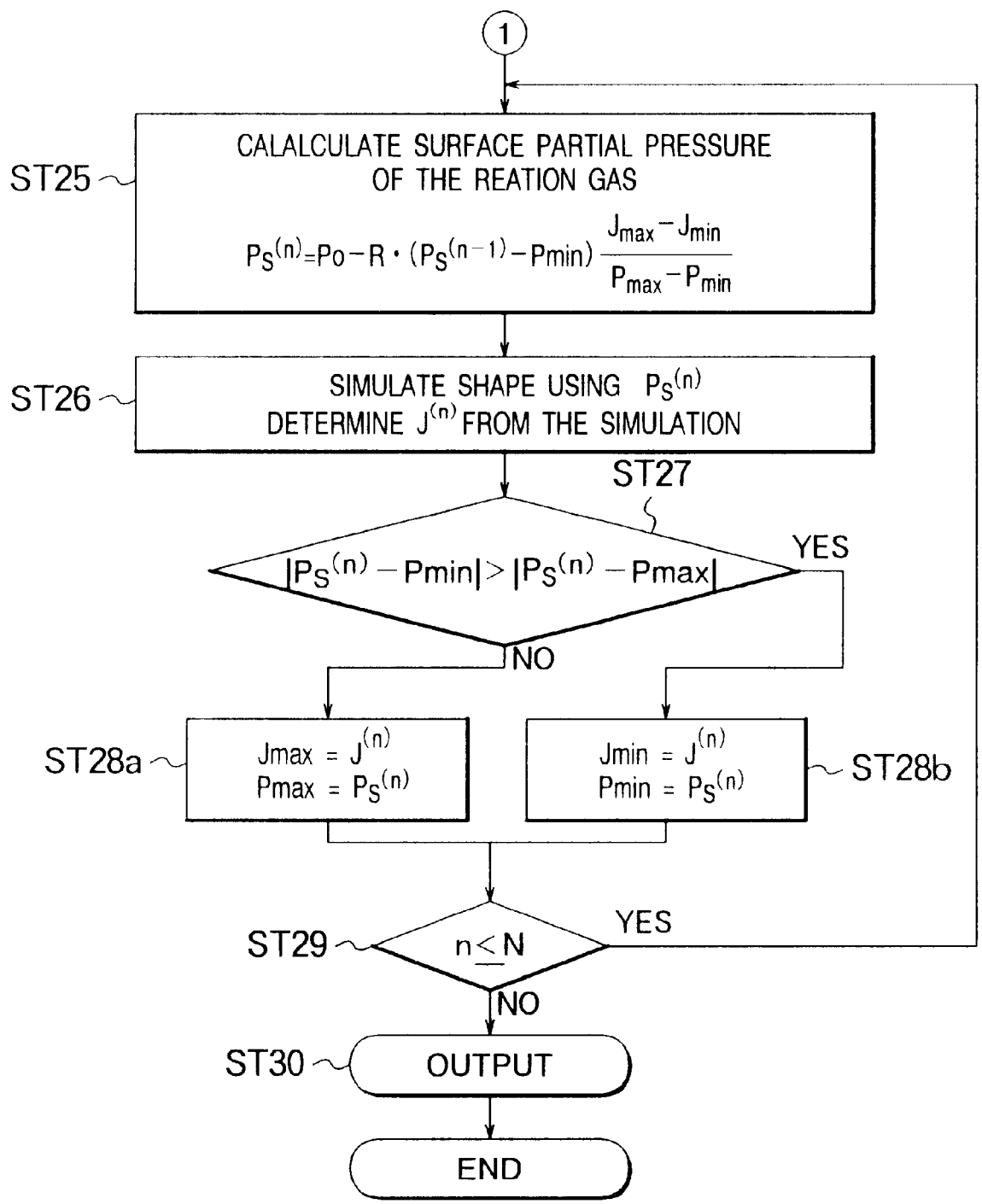
FIG. 7 is a flowchart showing a continuity of FIG. 6.

FIG. 6 and FIG. 7 are flowcharts showing the overall flow of the method of simulating the present embodiment.

At first, the pre-processor receives as input data concerning the sample such as the initial settings and the shape of the sample. The reaction gas pressure $P_S$ in the vicinity of the reaction gas feed port, the transport resistance R of the chamber, the reaction time T, and the simulation step time $\Delta t$, which is sufficiently small with respect to the reaction time T, are determined as invariables and are input to the pre-processor together with conditions such as the shape of the sample for simulation. By this, the number of simulation steps N=T/$\Delta t$ is found, and the conditions for calculation for the simulation are actually determined for every simulation. Further, the initial value of the flow of the reaction gas to the surface of the sample is defined as $J^{(0)}=0$, and the value of the variable n indicating the simulation step during processing is defined as n=1. Further, the variables $P_{min}$, $J_{min}$, $P_{max}$, and $J_{max}$ are prepared, and values of these four variables are all initialized to 0 (step ST21).

The following steps are carried out in the main processor. The partial pressure of the reaction gas at the surface of the sample in the first simulation step is found from the following equation by using the initial value $J^{(0)}$ of the flow of the reaction gas (step ST22):

$$P_S^{(1)} = P_0 - R \times J^{(0)} \quad (3)$$

Here, $P_S^{(1)}$ is the partial pressure of the reaction gas of the surface of the sample in the first simulation step.

The shape simulation is carried out for exactly the time $\Delta t$ by using the partial pressure of the reaction gas $P_S^{(1)}$ at the surface of the sample in the first simulation step found as described above. The total number $C^{(1)}$ of the molecules of the reaction gas reacted at the surface of the sample during the simulation is counted, and the flow $J^{(1)}$ of the reaction gas in the first simulation step is found from the following equation (step ST23):

$$J^{(1)} = C^{(1)}/(\Delta t \cdot S) \quad (4)$$

where, S is the surface area of the region into which the reaction gas of the shape simulation region is passed. Further, as $C^{(1)}$, it is also possible to use the difference between the number of the molecules of the reaction gas flowing into the calculation region in one simulation step time $\Delta t$ and the number of molecules flowing out. The values $P_S^{(1)}$ and $J^{(1)}$ of the partial pressure of the reaction gas and flow of the reaction gas at this time are substituted for $P_{max}$ and $J_{max}$, respectively. The number of the simulation step in processing is increased by one to make n equal to 2 (step ST24).

The partial pressure $P_S^{(n)}$ of the reaction gas at the surface of the sample during the n-th simulation step is found from the following equation (step ST25):

$$P_S^{(n)} = P_0 - R \times (P_S^{(n-1)} - P_{min}) \cdot (J_{max} - J_{min})/(P_{max} - P_{min}) \quad (5)$$

The shape simulation is carried out for exactly the time $\Delta t$ by using the partial pressure of the reaction gas $P_S^{(n)}$ in the n-th simulation step found as described above. The total number $C^{(n)}$ of the molecules of the reaction gas reacted at the surface of the sample during the simulation is counted, and the flow $J^{(n)}$ of the reaction gas in the n-th simulation step is found from the following equation (step ST26):

$$J^{(n)} = C^{(n)}/(\Delta t \cdot S) \quad (6)$$

where, S is the surface area of the region into which the reaction gas of the shape simulation region is passed. Further, as $C^{(n)}$, it is also possible to use the difference between the number of the molecules of the reaction gas flowing into the calculation region in one simulation step time $\Delta t$ and the number of molecules flowing out.

Next, the absolute value of $(P_S^{(n)} - P_{min})$ and the absolute value of $(P_S^{(n)} - P_{max})$ are compared (step ST27). Where the former is larger, $J^{(n)}$ is substituted for $J_{min}$ and $P_S^{(n)}$ is substituted for $P_{min}$ (step ST28a), while where the latter is larger, $J^{(n)}$ is substituted for $J_{max}$ and $P_S^{(n)}$ is substituted for $P_{max}$ (step ST28b).

The number of the simulation step in processing is increased by one to make n equal to n+1. Where n≦N, the processing routine returns to step ST25, where the simulation is continued. Where n>N, the simulation is ended (step ST29). The result of the obtained simulated shape is output to the post-processor (step ST30)

According to the method of simulating the shape of a sample after surface reaction processing of this embodiment of the present invention, the correct partial pressure of the reaction gas at the surface of the sample, which has been difficult to take into account in the simulation of the shape of a sample after CVD, etching, or other processing since an enormous calculation time was necessary, can be calculated. By this, highly precise simulation of the shape of a sample after CVD, etching, or other processing can be carried out in a shorter calculation time than that in the related art.

Further, according to the apparatus for simulation of the present invention, the above method of simulation can be preferably executed.

Further, according to the recording medium of the present invention, it is possible to store a program of the above method of simulation.

While the invention has been described with reference to specific embodiments chosen for purposes of illustration, it should be apparent that numerous modifications could be made thereto by those skilled in the art without departing from the basic concept and scope of the invention.

What is claimed is:

1. A computer system configured to effect a method of simulation for estimating the shape of a sample after surface reaction processing, said method comprising the steps of:

calculating a partial pressure $P_S$ of a reaction gas used for the surface reaction at the surface of the sample from the following equation:

$$P_S = P_0 - R \times J$$

using the partial pressure $P_0$ at a gas feed port of the reaction gas used for said surface reaction, a transport resistance R of the reaction gas in a chamber for performing said surface reaction, and a magnitude J of the flow of said reaction gas numerically found at the time of simulation and using $P_S$ in the simulation for estimating the shape of the sample after said surface reaction processing.

2. A computer system according to claim 1, wherein the magnitude J of the flow of said reaction gas is set to a value obtained by dividing a number C of molecules of the reaction gas reacted at said surface of the sample by a simulation step time $\Delta t$ and a surface area S of a region into which the reaction gas of the calculation region of the shape simulation is passed.

3. A computer system according to claim 1, wherein the magnitude J of the flow of said reaction gas is set to a value obtained by dividing a difference C between the number of molecules of the reaction gas flowing into the calculation region and the number of molecules flowing out from the calculation region at the surface of the sample in one simulation step time $\Delta t$ by the simulation step time $\Delta t$ and the surface area S of the region into which the reaction gas of the calculation region of the shape simulation is passed.

4. A computer system according to claim 1, comprising performing an initial setup concerning the reaction gas pressure $P_0$ in the vicinity of the reaction gas feed port, the transport resistance R of the chamber, reaction time T, the simulation step time $\Delta t$, which is sufficiently small with respect to the reaction time T, and a number of simulation steps $N = T/\Delta t$ and the input of the data concerning the sample;

setting an initial value of the flow of the reaction gas to the surface of the sample as $J^{(0)} = 0$ and setting the value of a variable n indicating the simulation step during processing as $n = 1$;

as a repetition step, calculating the partial pressure $P_S^{(n)}$ of the reaction gas at the surface of the sample in the n-th simulation step from the following equation by using the value $J^{(n-1)}$ of the flow of the reaction gas in the (n−1)th simulation step:

$$P_S^{(n)} = P_0 - R \times J^{(n-1)} \quad (1)$$

performing the shape simulation for exactly the time $\Delta t$ by using said partial pressure of the reaction gas $P_S^{(n)}$, counting the difference $C^{(n)}$ between the total number of molecules of the reaction gas reacted at the surface of the sample during the simulation or the number of molecules of the reaction gas flowing into the calculation region and the number of molecules flowing out from the calculation region in one simulation step time $\Delta t$, and calculating the flow $J^{(n)}$ of the reaction gas in the n-th simulation step from the following equation by using the surface area S of the region into which the reaction gas of the shape simulation region is passed and the simulation step time $\Delta t$:

$$J^{(n)} = C^{(n)}/(\Delta t \cdot S) \quad (2)$$

and repeating said repetition step until the number of simulation steps exceeds N.

5. A computer system according to claim 1, comprising:

performing the initial setting concerning the reaction gas pressure $P_0$ in the vicinity of the reaction gas feed port, the transport resistance R of the chamber, reaction time T, the simulation step time $\Delta t$, which is sufficiently small with respect to the reaction time T, and a number of simulation steps $N = T/\Delta t$ and the input of the data concerning the sample;

setting the initial value of the flow of the reaction gas to the surface of the sample as $J^{(0)} = 0$ and setting the value of the variable n indicating the simulation step during processing as $n = 1$;

preparing the variables $P_{min}$, $J_{min}$, $P_{max}$, and $J_{max}$ and initializing the values of these four variables are all initialized to 0;

calculating the partial pressure $P_S^{(1)}$ of the reaction gas at the surface of the sample in the first simulation step from the following equation by using the initial value $J^{(0)}$ of the flow of the reaction gas:

$$P_S^{(1)} = P_0 - R \times J^{(0)} \quad (3)$$

performing the shape simulation for exactly the time $\Delta t$ by using said partial pressure of the reaction gas $P_S^{(1)}$, counting the difference $C^{(1)}$ between the total number of molecules of the reaction gas reacted at the surface of the sample during the simulation or the number of molecules of the reaction gas flowing into the calculation region and the number of molecules flowing out from the calculation region in one simulation step time $\Delta t$, and finding the flow $J^{(1)}$ of the reaction gas in the first simulation step from the following equation by using the surface area S of the region into which the reaction gas of the shape simulation region is passed and the simulation step time $\Delta t$:

$$J^{(1)} = C^{(1)}/(\Delta t \cdot S) \quad (4)$$

substituting the value $P_S^{(1)}$ and $J^{(1)}$ of the partial pressure of the reaction gas and the flow of the reaction gas for $P_{max}$ and $J_{max}$;

increasing the number of simulation step in processing by one to make n equal to 2;

as a repetition step, calculating the partial pressure $P_S^{(n)}$ of the reaction gas at the surface of the sample in the n-th simulation step from the following equation by using the value $J^{(n-1)}$ of the flow of the reaction gas in the (n−1)th simulation step:

$$P_S^{(n)}=P_0-R\times(P_S^{(n-1)}-P_{min})\cdot(J_{max}-J_{min})/(P_{max}-P_{min}) \qquad (5)$$

performing the shape simulation for exactly the time Δt by using said partial pressure of the reaction gas $P_S^{(n)}$, counting the difference $C^{(n)}$ between the total number of molecules of the reaction gas reacted at the surface of the sample during the simulation or the number of molecules of the reaction gas flowing into the calculation region and the number of molecules flowing out from the calculation region in one simulation step time Δt, and calculating the flow $J^{(n)}$ of the reaction gas in the n-th simulation step from the following equation by using the surface area S of the region into which the reaction gas of the shape simulation region is passed and the simulation step time Δt:

$$J^{(n)}=C^{(n)}/(\Delta t\cdot S) \qquad (6)$$

comparing an absolute value of $(P_S^{(n)}-P_{min})$ and absolute value of $(P_S^{(n)}-P_{max})$ and, where the absolute value of $(P_S^{(n)}-P_{min})$ is larger, substituting $J^{(n)}$ for $J_{min}$ and $P_S^{(n)}$ for $P_{min}$, and where the absolute value of $(P_S^{(n)}-P_{max})$ is larger, substituting $J^{(n)}$ for $J_{max}$ and $P_S^{(n)}$ for $P_{max}$, and repeating said repetition step until the number of simulation steps exceeds N.

6. An apparatus for simulation for estimating the shape of a sample after surface reaction processing comprising:

a pre-processing means for creating a model of said sample and processing various data;

a main simulation unit for performing a simulation for calculating the partial pressure $P_S$ of reaction gas used for the surface reaction at the surface of the sample from the following equation:

$$P_S=P_0-R\times J$$

using the partial pressure $P_0$ at a gas feed port of the reaction gas used for said surface reaction, a transport resistance R of the reaction gas in a chamber for performing said surface reaction, and a magnitude J of the flow of said reaction gas numerically found at the time of simulation and using $P_S$ in the simulation for estimating the shape of sample after said surface reaction processing; and a post-processing means for converting the shape of a sample data output from said main simulation unit to a shape adapted to the predetermined output format and outputting the same.

7. An apparatus for simulation according to claim 6, wherein said main simulation unit carries out the simulation by using a value obtained by dividing the number C of molecules of the reaction gas reacted at said surf ace of the sample by the simulation step time Δt and the surface area S of the region into which the reaction gas of the calculation region of the shape simulation is passed as the magnitude J of the flow of said reaction gas.

8. An apparatus for simulation according to claim 6, wherein said main simulation unit carries out the simulation by using a value obtained by dividing the difference C between the number of molecules of the reaction gas flowing into the calculation region and the number of molecules flowing out from the calculation region at said surface of the sample in one simulation step time Δt by the simulation step time Δt and the surface area S of the region into which the reaction gas of the calculation region of the shape simulation is passed as the magnitude J of the flow of said reaction gas.

9. An apparatus for simulation according to claim 6, wherein said pre-processing means and said main simulation unit, perform the initial setup concerning the reaction gas pressure $P_0$ in the vicinity of the reaction gas feed port, transport resistance R of the chamber, reaction time T, simulation step time Δt, which is sufficiently small with respect to the reaction time T, and a number of simulation steps N=T/Δt and the input of the data concerning the sample;

set the initial value of the flow of the reaction gas to the surface of the sample as $J^{(0)}=0$ and set the value of a variable n indicating the simulation step during processing as n=1;

as a repetition step, calculate the partial pressure $P_S^{(n)}$ of the reaction gas at the surface of the sample in the n-th simulation step from the following equation by using the value $J^{(n-1)}$ of the flow of the reaction gas in the (n−1)th simulation step:

$$P_S^{(n)}=P_0-R\times J^{(n-1)} \qquad (1)$$

perform the shape simulation for exactly the time Δt by using said partial pressure of the reaction gas $P_S^{(n)}$, count the difference $C^{(n)}$ between the total number of molecules of the reaction gas reacted at the surface of the sample during the simulation or the number of molecules of the reaction gas flowing into the calculation region and the number of molecules flowing out from the calculation region in one simulation step time Δt, and calculate the flow $J^{(n)}$ of the reaction gas in the n-th simulation step from the following equation by using the surface area S of the region into which the reaction gas of the shape simulation region is passed and the simulation step time Δt:

$$J^{(n)}=C^{(n)}/(\Delta t\cdot S) \qquad (2)$$

and repeat said repetition step until the number of simulation steps exceeds N.

10. An apparatus for simulation according to claim 6, wherein said pre-processing means and said main simulation unit, perform the initial setup concerning the reaction gas pressure $P_0$ in the vicinity of the reaction gas feed port, transport resistance R of the chamber, reaction time T, simulation step time Δt, which is sufficiently small with respect to the reaction time T, and a number of simulation steps N=T/Δt and the input of the data concerning the sample;

set the initial value of the flow of the reaction gas to the surface of the sample as $J^{(0)}=0$ and set the value of the variable n indicating the simulation step during processing as n=1;

prepare variables $P_{min}$, $J_{min}$, $P_{max}$, and $J_{max}$ and initialize the values of these four variables to 0;

calculate the partial pressure $P_S^{(1)}$ of the reaction gas at the surface of the sample in the first simulation step from the following equation by using the initial value $J^{(0)}$ of the flow of the reaction gas:

$$P_S^{(1)} = P_0 - R \times J^{(0)} \qquad (3)$$

perform the shape simulation for exactly the time $\Delta t$ by using said partial pressure of the reaction gas $P_S^{(1)}$, count the difference $C^{(1)}$ between the total number of molecules of the reaction gas reacted at the surface of the sample during the simulation or the number of molecules of the reaction gas flowing into the calculation region and the number of molecules flowing out from the calculation region in one simulation step time $\Delta t$, and find the flow $J^{(1)}$ of the reaction gas in the first simulation step from the following equation by using the surface area S of the region into which the reaction gas of the shape simulation region is passed and the simulation step time $\Delta t$:

$$J^{(1)} = C^{(1)}/(\Delta t \cdot S) \qquad (4)$$

substitute the value $P_S^{(1)}$ and $J^{(1)}$ of the partial pressure of the reaction gas and the flow of the reaction gas respectively for $P_{max}$ and $J_{max}$;

increase the number of simulation step in processing by one to make n equal to 2;

as a repetition step, calculate the partial pressure $P_S^{(n)}$ of the reaction gas at the surface of the sample in the n-th simulation step from the following equation by using the value $J^{(n-1)}$ of the flow of the reaction gas in the (n-1)th simulation step:

$$P_S^{(n)} = P_0 - R \times (P_S^{(n-1)} - P_{min}) \cdot (J_{max} - J_{min})/(P_{max} - P_{min}) \qquad (5)$$

perform the shape simulation for exactly the time $\Delta t$ by using said partial pressure of the reaction gas $P_S^{(n)}$, count the difference $C^{(n)}$ between the total number of molecules of the reaction gas reacted at the surface of the sample during the simulation or the number of molecules of the reaction gas flowing into the calculation region and the number of molecules flowing out from the calculation region in one simulation step time $\Delta t$, and calculate the flow $J^{(n)}$ of the reaction gas in the n-th simulation step from the following equation by using the surface area S of the region into which the reaction gas of the shape simulation region is passed and the simulation step time $\Delta t$:

$$J^{(n)} = C^{(n)}/(\Delta t \cdot S) \qquad (6)$$

compare an absolute value of $(P_S^{(n)} - P_{min})$ and absolute value of $(P_S^{(n)} - P_{max})$ and, where the absolute value of $(P_S^{(n)} - P_{min})$ is larger, substitute $J^{(n)}$ for $J_{min}$ and $P_S^{(n)}$ for $P_{min}$ and where the absolute value of $(P_S^{(n)} - P_{max})$ is larger, substitute $J^{(n)}$ for $J_{max}$ and $P_S^{(n)}$ for $P_{max}$, and repeat said repetition step until the number of simulation steps exceeds N.

11. A recording medium which stores a program for estimating the shape of a sample after surface reaction processing comprising calculating the partial pressure $P_S$ of reaction gas used for the surface reaction at the surface of the sample from the following equation:

$$P_S = P_0 - R \times J$$

using the partial pressure $P_0$ in the gas feed port of the reaction gas used for said surface reaction, the transport resistance R of the reaction gas in the chamber for performing said surface reaction, and the magnitude J of the flow of said reaction gas numerically found at the time of simulation and taking this $P_S$ into account in the simulation to calculate the shape of the sample after said surface reaction processing.

12. A recording medium according to claim 11, which stores a simulation program wherein the magnitude J of the flow of said reaction gas is set to a value obtained by dividing a number C of molecules of the reaction gas reacted at said surface of the sample by a simulation step time $\Delta t$ and a surface area S of a region into which the reaction gas of the calculation region of the shape simulation is passed.

13. A recording medium according to claim 11, which stores a simulation program wherein the magnitude J of the flow of said reaction gas is set to a value obtained by dividing a difference C between the number of molecules of the reaction gas flowing into the calculation region and the number of molecules flowing out from the calculation region at the surface of the sample in one simulation step time $\Delta t$ by the simulation step time $\Delta t$ and the surface area S of the region into which the reaction gas of the calculation region of the shape simulation is passed.

14. A recording medium according to claim 11, which stores a simulation program performing an initial setup concerning the reaction gas pressure $P_0$ in the vicinity of the reaction gas feed port, the transport resistance R of the chamber, reaction time T, the simulation step time $\Delta t$, which is sufficiently small with respect to the reaction time T, and a number of simulation steps $N = T/\Delta t$ and the input of the data concerning the sample;

setting an initial value of the flow of the reaction gas to the surface of the sample as $J^{(0)} = 0$ and setting the value of a variable n indicating the simulation step during processing as n=1;

as a repetition step, calculating the partial pressure $P_S^{(n)}$ of the reaction gas at the surface of the sample in the n-th simulation step from the following equation by using the value $J^{(n-1)}$ of the flow of the reaction gas in the (n−1)th simulation step:

$$P_S^{(n)} = P_0 - R \times J^{(n-1)} \qquad (1)$$

performing the shape simulation for exactly the time $\Delta t$ by using said partial pressure of the reaction gas $P_S^{(n)}$, counting the difference $C^{(n)}$ between the total number of molecules of the reaction gas reacted at the surface of the sample during the simulation or the number of molecules of the reaction gas flowing into the calculation region and the number of molecules flowing out from the calculation region in one simulation step time $\Delta t$, and calculating the flow $J^{(n)}$ of the reaction gas in the n-th simulation step from the following equation by using the surface area S of the region into which the reaction gas of the shape simulation region is passed and the simulation step time Δt:

$$J^{(n)}=C^{(n)}/(\Delta t \cdot S) \quad (2)$$

and repeating said repetition step until the number of simulation steps exceeds N.

15. A recording medium according to claim 11, which stores a simulation program performing the initial setting concerning the reaction gas pressure $P_0$ in the vicinity of the reaction gas feed port, the transport resistance R of the chamber, reaction time T, the simulation step time Δt, which is sufficiently small with respect to the reaction time T, and a number of simulation steps N=T/Δt and the input of the data concerning the sample;

setting the initial value of the flow of the reaction gas to the surface of the sample as $J^{(0)}=0$ and setting the value of the variable n indicating the simulation step during processing as n=1;

preparing the variables $P_{min}$, $J_{min}$, $P_{max}$, and $J_{max}$ and initializing the values of these four variables are all initialized to 0;

calculating the partial pressure $P_S^{(1)}$ of the reaction gas at the surface of the sample in the first simulation step from the following equation by using the initial value $J^{(0)}$ of the flow of the reaction gas:

$$P_S^{(1)}=P_0-R \times J^{(0)} \quad (3)$$

performing the shape simulation for exactly the time Δt by using said partial pressure of the reaction gas $P_S^{(1)}$, counting the difference $C^{(1)}$ between the total number of molecules of the reaction gas reacted at the surface of the sample during the simulation or the number of molecules of the reaction gas flowing into the calculation region and the number of molecules flowing out from the calculation region in one simulation step time Δt, and finding the flow $J^{(1)}$ of the reaction gas in the first simulation step from the following equation by using the surface area S of the region into which the reaction gas of the shape simulation region is passed and the simulation step time Δt:

$$J^{(1)}=C^{(1)}/(\Delta t \cdot S) \quad (4)$$

substituting the value $P_S^{(1)}$ and $J^{(1)}$ of the partial pressure of the reaction gas and the flow of the reaction gas for $P_{max}$ and $J_{max}$;

increasing the number of simulation step in processing by one to make n equal to 2;

as a repetition step, calculating the partial pressure $P_S^{(n)}$ of the reaction gas at the surface of the sample in the n-th simulation step from the following equation by using the value $J^{(n-1)}$ of the flow of the reaction gas in the (n-1)th simulation step:

$$P_S^{(n)}=P_0-R \times (P_S^{(n-1)}-P_{min}) \cdot (J_{max}-J_{min})/(P_{max}-P_{min}) \quad (5)$$

performing the shape simulation for exactly the time Δt by using said partial pressure of the reaction gas $P_S^{(n)}$, counting the difference $C^{(n)}$ between the total number of molecules of the reaction gas reacted at the surface of the sample during the simulation or the number of molecules of the reaction gas flowing into the calculation region and the number of molecules flowing out from the calculation region in one simulation step time Δt and calculating the flow $J^{(n)}$ of the reaction gas in the n-th simulation step from the following equation by using the surface area S of the region into which the reaction gas of the shape simulation region is passed and the simulation step time Δt:

$$J^{(n)}=C^{(n)}/(\Delta t \cdot S) \quad (6)$$

comparing an absolute value of $(P_S^{(n)}-P_{min})$ and absolute value of $(P_S^{(n)}-P_{max})$ and, where the absolute value of $(P_S^{(n)}-P_{min})$ is larger, substituting $J^{(n)}$ for $J_{min}$ and $P_S^{(n)}$ for $P_{min}$, and where the absolute value of $(P_S^{(n)}-P_{max})$ is larger, substituting $J^{(n)}$ for $J_{max}$ and $P_S^{(n)}$ for $P_{max}$, and repeating said repetition step until the number of simulation steps exceeds N.

* * * * *